(12) United States Patent
Bietz et al.

(10) Patent No.: US 8,354,903 B1
(45) Date of Patent: Jan. 15, 2013

(54) METER DISCONNECT RELAY

(75) Inventors: Steven Lee Bietz, Cumming, GA (US);
Rathindra Nahar, Suwanee, GA (US);
Bruce Joni Tomson, Marietta, GA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/326,977

(22) Filed: Dec. 15, 2011

Related U.S. Application Data

(60) Provisional application No. 61/525,599, filed on Aug. 19, 2011.

(51) Int. Cl.
*H01H 67/06* (2006.01)
(52) U.S. Cl. .......................................... 335/127; 335/131
(58) Field of Classification Search .................. 335/126, 335/131
See application file for complete search history.

(56) References Cited

U.S. PATENT DOCUMENTS

| | | | | |
|---|---|---|---|---|
| 3,942,144 A | * | 3/1976 | Contal | 335/132 |
| 3,964,006 A | * | 6/1976 | Lacan | 335/132 |
| 4,899,073 A | * | 2/1990 | Takeuchi et al. | 310/116 |
| 5,364,290 A | * | 11/1994 | Hartman | 439/517 |
| 5,530,738 A | * | 6/1996 | McEachern | 379/88.16 |
| 6,377,143 B1 | * | 4/2002 | Zhou et al. | 335/132 |
| 6,822,544 B2 | * | 11/2004 | Shiga et al. | 335/126 |
| 7,011,551 B2 | * | 3/2006 | Johansen et al. | 439/709 |
| 7,772,945 B2 | * | 8/2010 | Lange | 335/167 |
| 8,159,321 B2 | * | 4/2012 | Bollinger et al. | 335/132 |
| 2010/0026427 A1 | * | 2/2010 | Moeller et al. | 335/71 |
| 2011/0037543 A1 | | 2/2011 | Lange | |

* cited by examiner

*Primary Examiner* — Elvin G Enad
*Assistant Examiner* — Lisa Homza
(74) *Attorney, Agent, or Firm* — David A. Cornett; Ernest G. Cusick; Frank A. Landgraff

(57) ABSTRACT

In one aspect, a meter disconnect relay is described that is comprised of a base, an actuator, a shuttle and one or more disconnect switches. The shuttle is operably connected to and moved by a plunger of the actuator. The one or more disconnect switches can be opened or closed by movement of the shuttle, wherein each disconnect switch is comprised of a rigid, conductive bridging section comprising at least two contacts; a conductive source portion having a source contact and a conductive load portion having a load contact.

44 Claims, 6 Drawing Sheets

METER DISCONNECT RELAY

CROSS REFERENCE TO RELATED APPLICATIONS

This application claims benefit of and priority to U.S. Provisional Patent application No. 61/525,599, filed Aug. 19, 2011, which is fully incorporated by reference herein and made a part hereof. This application is also related to pending U.S. patent applications having Ser. Nos. 13/327,006 and 13/327,033 respectively, filed concurrently herewith, which are each fully incorporated by reference herein and made a part hereof.

BACKGROUND OF THE INVENTION

Disconnect relays used in meters today are expensive due to high part count, complexity, copper content, and precious metals content. Further, disconnect relays in the market place today typically use methods such as flexible conductor "arms"/contact "arms" that have practical limitations that necessitate lower contact force (i.e. in 2-3.5 Newtons (N) range). Contacts commonly used in meter service disconnect relays today typically use a silver tin alloy. The silver tin contacts under a fault condition will flow (or sacrifice) the silver to the outer edge of the contact surface. Depending on the severity and frequency of surge/s the copper substrate will be exposed and the contact silver will have an irregular surface. These conditions create higher resistance and arching that hastens the disconnect relay failure through either high heat rise and plastics melting or loss of relay connection. Further, common disconnect relays in the field today often weld after one to two 7000 amp fault conditions for 6 electrical cycles and may not operate or have a significantly shortened contact life. Further, systems commonly used today typically will not survive 12000 amp fault conditions for 4 electrical cycles. In contrast, the market available relays used in today's meters generally have contact blow-off and often break their housing/insulation in the 12000 KVA 4 electrical cycle test.

Therefore, disconnect relays and contact materials that overcome challenges in the art, some of which are described above, are desired.

BRIEF DESCRIPTION OF THE INVENTION

Described herein are embodiments of a meter service disconnect relay.

In one aspect, a meter disconnect relay is described that is comprised of a base, an actuator, a shuttle and one or more disconnect switches. The actuator can be situated within the base, wherein the base maintains a portion of the actuator stationary and allows a plunger of the actuator to move within the base. The shuttle can be at least partially comprised of non-conductive material and having one or more windows, wherein the shuttle is operably connected to and moved by the plunger of the actuator and wherein the shuttle can be moved within the base and at least a portion of the base provides a stop for movement of the shuttle. The one or more disconnect switches can be opened or closed by movement of the shuttle, wherein each disconnect switch is comprised of a rigid, conductive bridging section pivotally connected to a first face of one of the one or more windows in the shuttle, wherein the bridging section comprises at least two contacts; a leaf spring pivotally connected to a second face of the one of the one or more windows of the shuttle, wherein the second face of the window is opposite the first face of the window and the leaf spring applies force to the bridging section; and a conductive source portion having a source contact and a conductive load portion having a load contact, wherein a first and second contact of the at least two contacts of the bridging portion are caused to substantially simultaneously come in contact with and disconnect from the source contact and the load contact by movement of the shuttle.

In another aspect, a system is described. The system is comprised of a meter and a meter disconnect relay integrated with the meter. The meter disconnect relay is comprised of a base, an actuator, a shuttle and one or more disconnect switches. The actuator can be situated within the base, wherein the base maintains a portion of the actuator stationary and allows a plunger of the actuator to move within the base. The shuttle can be at least partially comprised of non-conductive material and having one or more windows, wherein the shuttle is operably connected to and moved by the plunger of the actuator and wherein the shuttle can be moved within the base and at least a portion of the base provides a stop for movement of the shuttle. The one or more disconnect switches can be opened or closed by movement of the shuttle, wherein each disconnect switch is comprised of a rigid, conductive bridging section pivotally connected to a first face of one of the one or more windows in the shuttle, wherein the bridging section comprises at least two contacts; a leaf spring pivotally connected to a second face of the one of the one or more windows of the shuttle, wherein the second face of the window is opposite the first face of the window and the leaf spring applies force to the bridging section; and a conductive source portion having a source contact and a conductive load portion having a load contact, wherein a first and second contact of the at least two contacts of the bridging portion are caused to substantially simultaneously come in contact with and disconnect from the source contact and the load contact by movement of the shuttle.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION OF THE INVENTION

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed herein, and while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Figure 1:
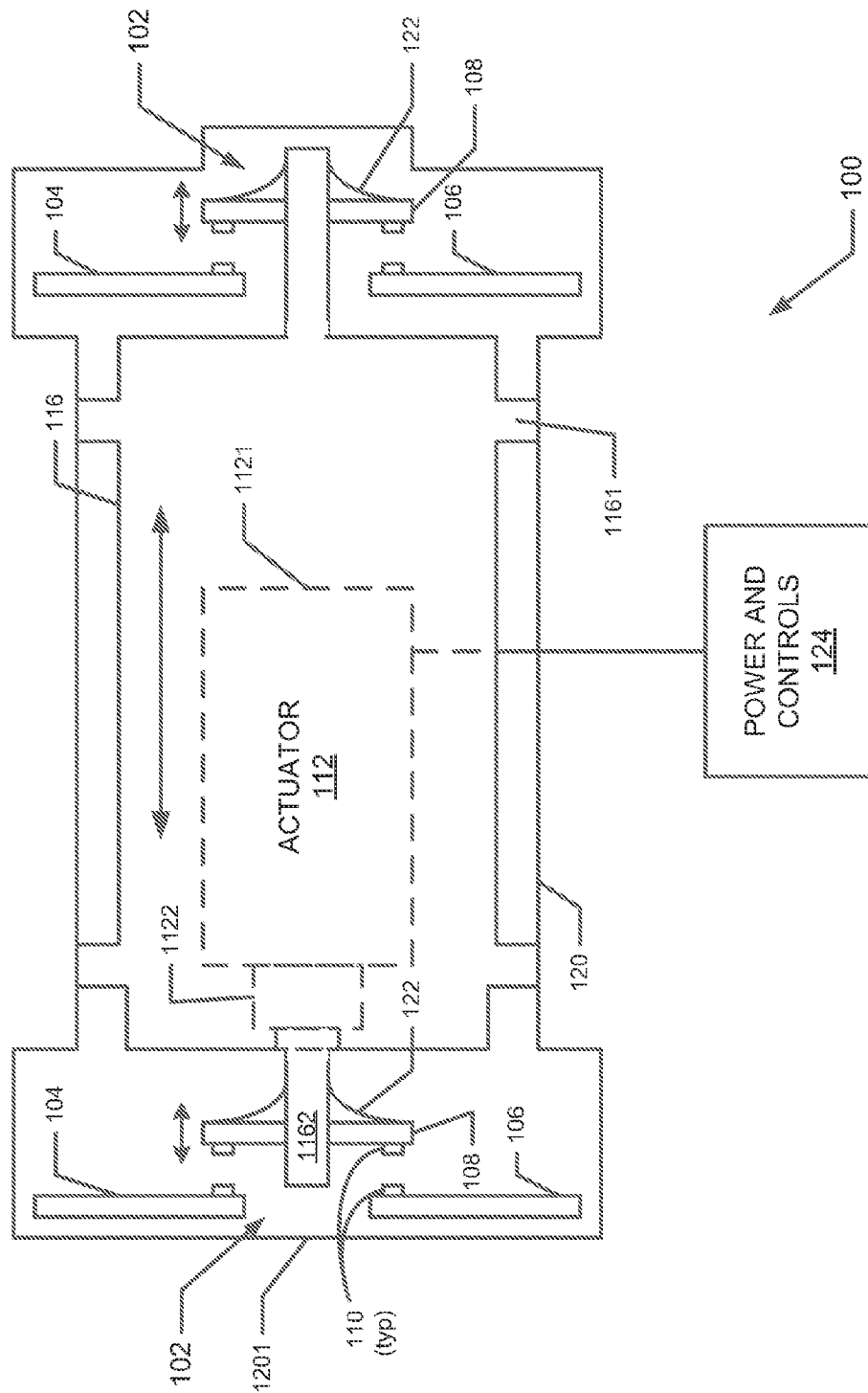
FIG. 1 illustrates an embodiment of a meter disconnect relay.

FIG. 1 illustrates an embodiment of a meter disconnect relay 100. The embodiment shown in FIG. 1 is comprised of two disconnect switches 102, though more or fewer disconnect switches 102 are contemplated within the scope of embodiments of the invention. Each embodiment of a disconnect switch 102 is comprised of a source side 104, a load side 106, and a bridging portion 108. In one aspect, the bridging portion 108 comprises solid, rigid electrically conductive material such as copper, silver, aluminum, combinations thereof, and the like. Contacts 110 on the bridging portion 108 come in contact with contacts 110 on the source 104 and load 106 sections when the switch 102 is closed. Similarly, the contacts 110 are separated when the switch 102 is opened. In one aspect, an actuator 112 is used to open and close the one or more switches 102. In one aspect, the actuator 112 comprises an electrical solenoid though other types of actuators such as hydraulic or pneumatic actuators are contemplated with the scope of embodiments of the present invention. In one aspect, the actuator 112 can be used to adjust the force applied to the source 104 contacts 110 and the load 106 contacts 110 by the contacts 110 of the bridging section 108.

Generally, the actuator 112 is comprised of a stationary portion 1121 that is affixed and held in place by a base 120 of the meter disconnect relay 100 and a plunger 1122 that moves into and out of the stationary portion 1121 of the actuator 112. In one aspect, as shown in FIG. 1, the actuator 112 is connected to a shuttle 116 through the plunger 1122. The shuttle 116 is generally moveable within the base 120. Generally, the shuttle 116 moves linearly within the base 120. In one aspect, tabs or wings 1161 on the shuttle 116 fit in grooves or slots of the base 120 in order to provide controlled movement of the shuttle 116 within the base 120. In one aspect, a portion of the base 120 such as wall 1201 can provide a stop to stop the movement of the shuttle 116 as a portion 1162 of the shuttle 116 is configured to come into contact with the wall portion 1201 at the fullest extent of travel of the shuttle 116, though other means of stopping the travel of the shuttle 116 are considered within the scope of embodiments of the invention. Generally, the shuttle 116 is at least partially comprised of non-conductive material and has one or more windows (not shown in FIG. 1), wherein there is a window for each disconnect switch 102.

When the plunger 114 moves, it moves the shuttle 116 thereby opening or closing the one or more disconnect switches 102. In addition to the source side 104, load side 106, and bridging portion 108, each disconnect switch 102 is further comprised of a leaf spring 122. In one aspect, the rigid, conductive bridging section 108 can be pivotally connected to a first face of one of the one or more windows in the shuttle 116. As noted above, the bridging section 108 generally comprises at least two contacts 110, though more or fewer contacts 110 are contemplated within embodiments of the present invention. The leaf spring 122 can be pivotally connected to a second face of the one of the one or more windows of the shuttle 116, wherein the second face of the window is opposite the first face of the window and the leaf spring 122 applies force to the bridging section 108.

The first and second contacts 110 of the at least two contacts of the bridging portion 108 are caused to substantially simultaneously come in contact with and disconnect from the source contact and the load contact by movement of the shuttle 116. In one aspect, the shuttle 116 continues to travel beyond the point where first and second contacts of the at least two contacts of the bridging portion 108 first substantially simultaneously come in contact with the source contact and the load contact. This over travel of the shuttle 116 can cause additional force to be applied to the source contact and the load contact by the at least two contacts of the bridging portion through compression of the leaf spring 122.

Further comprising the embodiment of a meter disconnect relay 100 as shown in FIG. 1 are power and controls 124 that provide a source of energy to the actuator 112 and control the movement of the actuator 112. For example, if the actuator 112 were pneumatic, the energy source may be compressed air that is controlled by an arrangement of valves. Similarly, if the actuator were an electric solenoid, the energy source may be electrical power that is controlled by changing the current direction through the windings of the solenoid causing the plunger 1122 to move out of or in to the solenoid body 1121, depending upon the direction of the current.

Figure 2:
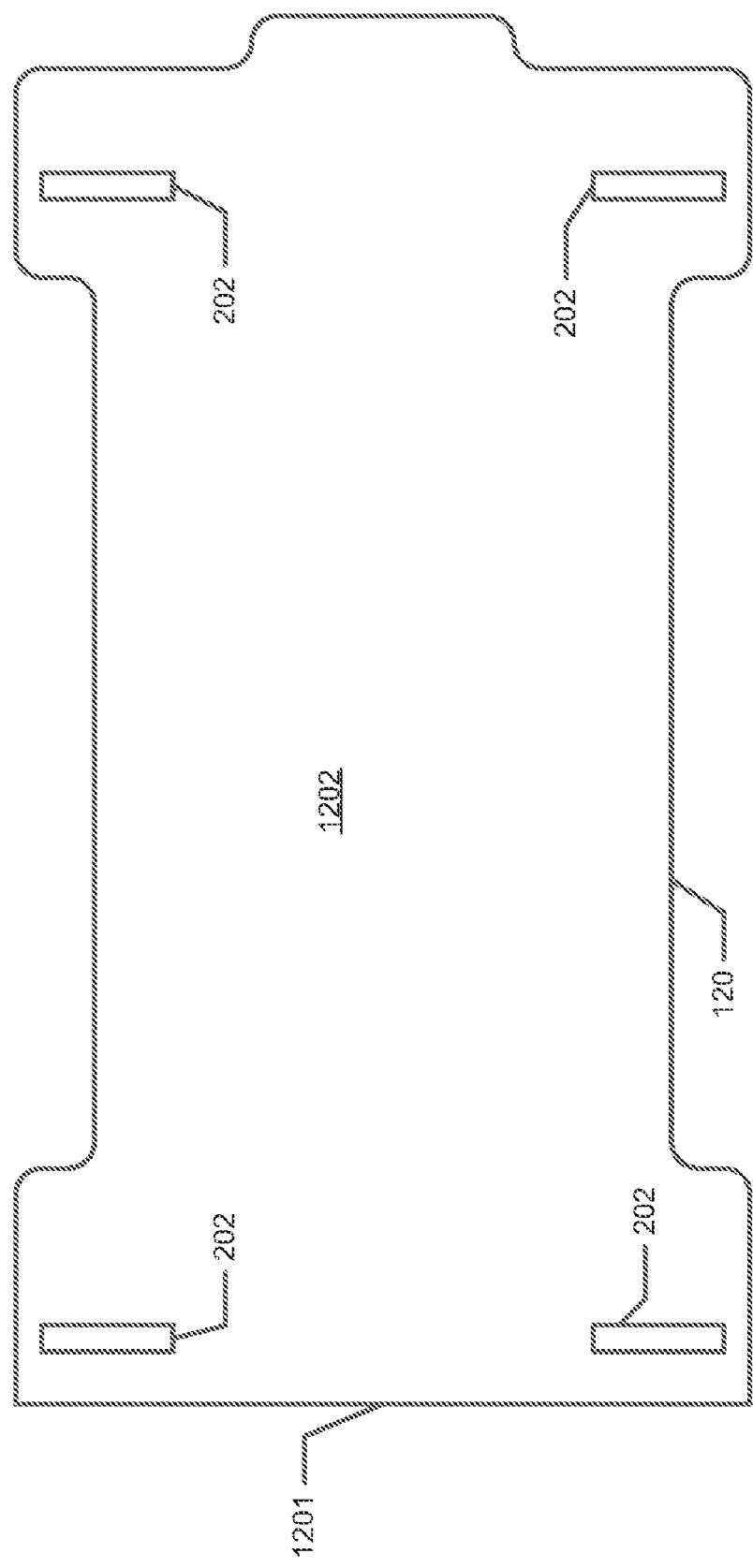
FIG. 2 illustrates an aspect of a base that can be used to practice an embodiment of a meter disconnect relay.

FIG. 2 illustrates an aspect of a base 120 that can be used to practice an embodiment of a meter disconnect relay 100. As noted herein, in one aspect a wall section 1201 of the base 120 can be used to stop travel of the shuttle 116. The base 120 can be comprised of electrically conductive materials such as metal, non-conductive materials such as plastic or fiberglass, or combinations thereof. It can be configured such that the meter disconnect relay can fit within other apparatus such as within the base of a revenue meter. Generally, the base 120 is pan-like in shape in that it has a bottom 1202 and walls 1201, but an open top. In one aspect, slots 202 are provided for conductive stabs to come through the bottom 1202 (shown) or sides 1201 (not shown) of the base 120 and connect with the source 104 and load 106 sections.

Figure 3:
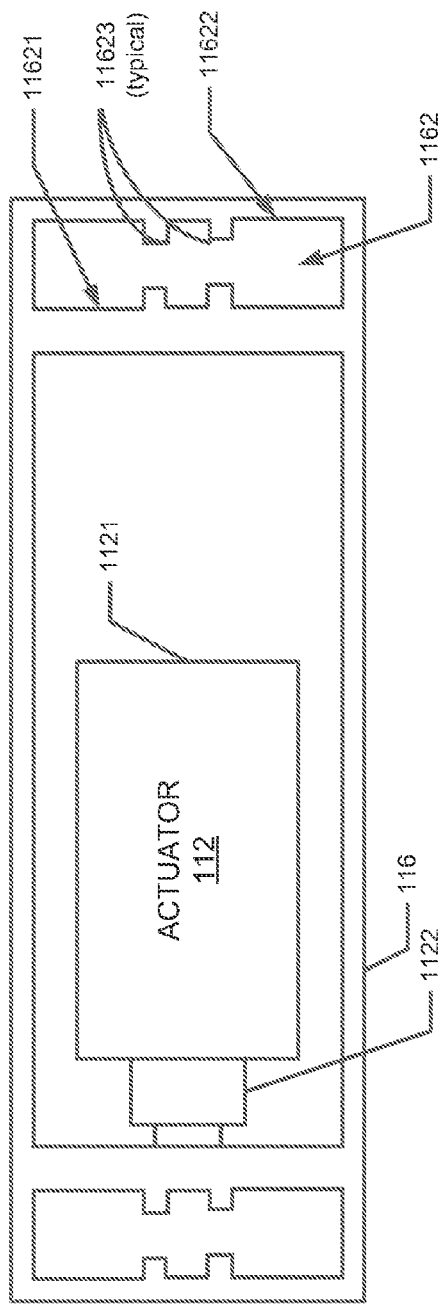
FIGS. 3 and 4 illustrate side (elevation) views of aspects of shuttles that can be used according to embodiments of a meter disconnect relay.
Figure 4:
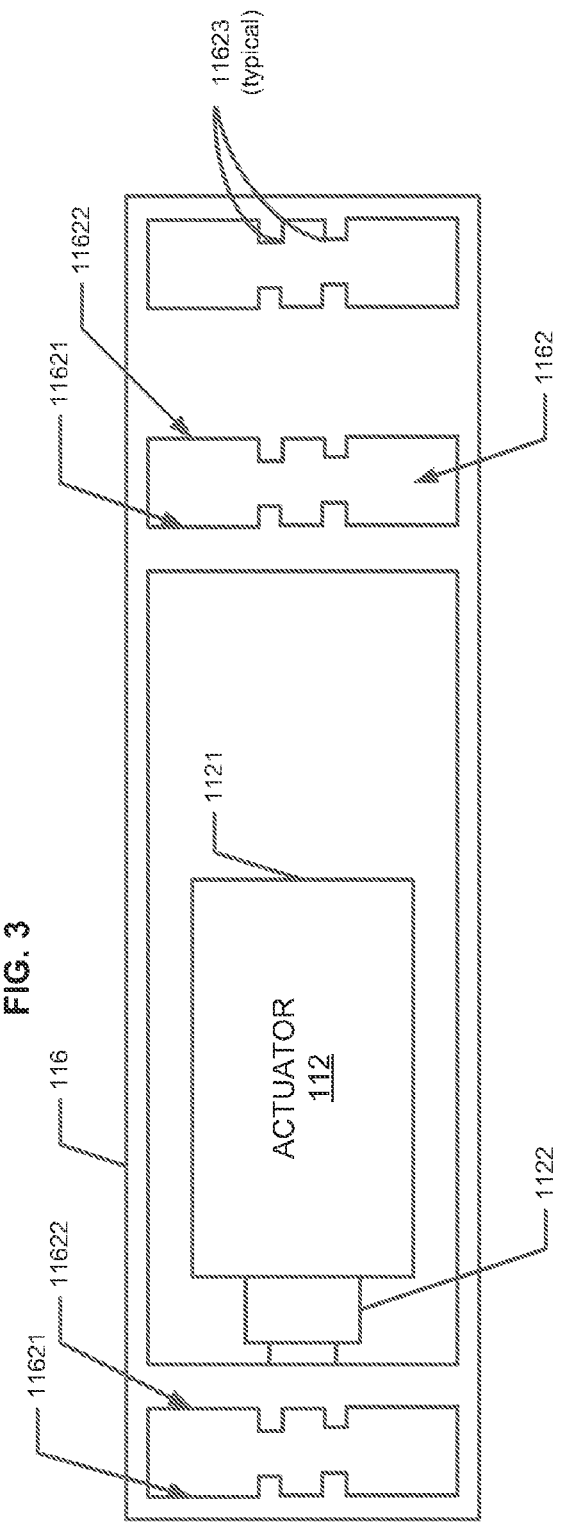

FIGS. 3 and 4 illustrate side (elevation) views of aspects of shuttles 116 that can be used according to embodiments of a meter disconnect relay 100. As shown in FIGS. 3 and 4, each shuttle 116 is comprised of one or more windows 1162. Each window 1162 corresponds to a disconnect switch 102 of the meter disconnect relay 100. Each window 1162 comprises at least a first face 11621 and a second face 11622. In one aspect, the a rigid, conductive bridging section 108 can be pivotally connected to the first face 1162 of one of the one or more windows 1162 in the shuttle 116 and the leaf spring 122 can be pivotally connected to the second face 11622 of the one of the one or more windows 1162 of the shuttle 116, wherein the second face 11622 of the window 1162 is opposite the first face 11621 of the window 1162 and the leaf spring 122 applies force to the bridging section 108. In one aspect, the rigid, conductive bridging section 108 can be pivotally connected to the first face 11621 of a window 1162 in the shuttle 116 by one or more pins 11623 extending from the first face 11621 of the window 1162 and the leaf spring 122 can be pivotally connected to the second face 11622 of a window 1162 of the shuttle 116 by one or more pins 11623 extending from the second face 11622 of the window 1162, though more or fewer pins 11623 or other means of connecting the conducting bridge 108 and the leaf spring 122 to the windows 1162 are contemplated within embodiments of the present invention.

In one aspect, the shuttle 116 can be configured such that the body 1121 of the actuator 112 is held stationary within the shuttle 116 while the plunger 1122 can move thus causing the shuttle 116 to move around the stationary actuator body 1121. In one aspect, the actuator body 1121 can be held stationary by fingers or tabs extending from the wall 1201 or bottom 1202 of the base 120.

As shown in FIGS. 3 and 4, the shuttle 116 can comprise one or more windows 1162, wherein each window 1162 corresponds to a disconnect switch 102. Therefore, a shuttle 116 can be configured having one window 1162, two windows 1162 (FIG. 3), three windows 1162 (FIG. 4), and more. In this way, the meter disconnect relay 100 can be configured to substantially simultaneously open or close multiple disconnect switches 102 using only a single actuator 112 by movement of the shuttle 116.

Figure 5:
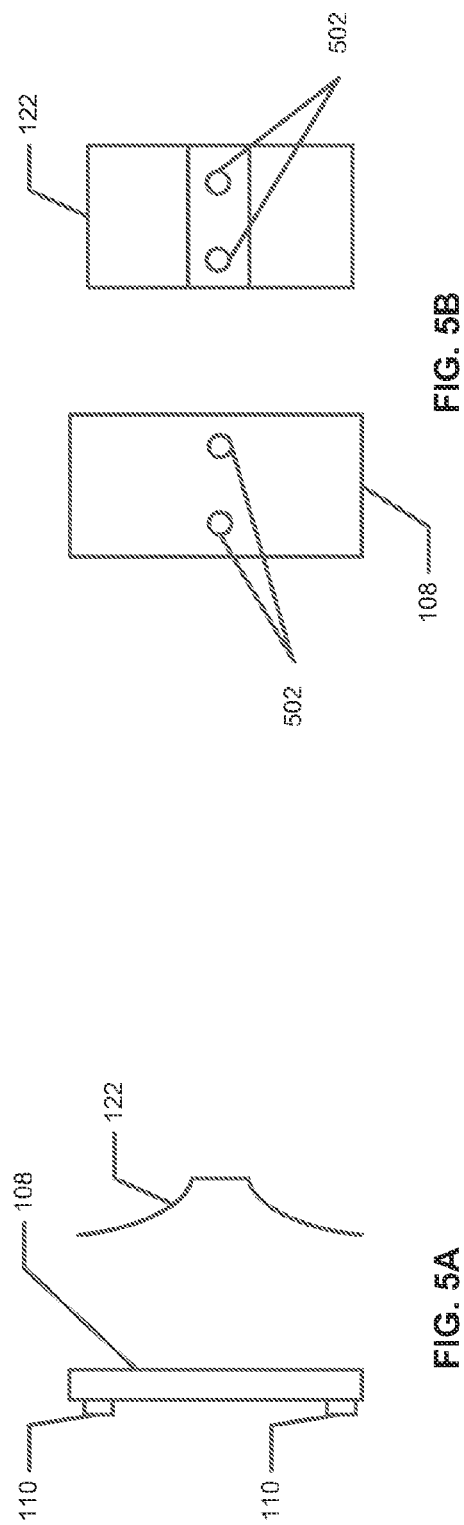
FIGS. 5A, 5B and 5C illustrate various exploded views and aspects of the conductive bridging section and leaf spring of the one or more disconnect switches of an embodiment of a meter disconnect relay.
Figure 6:
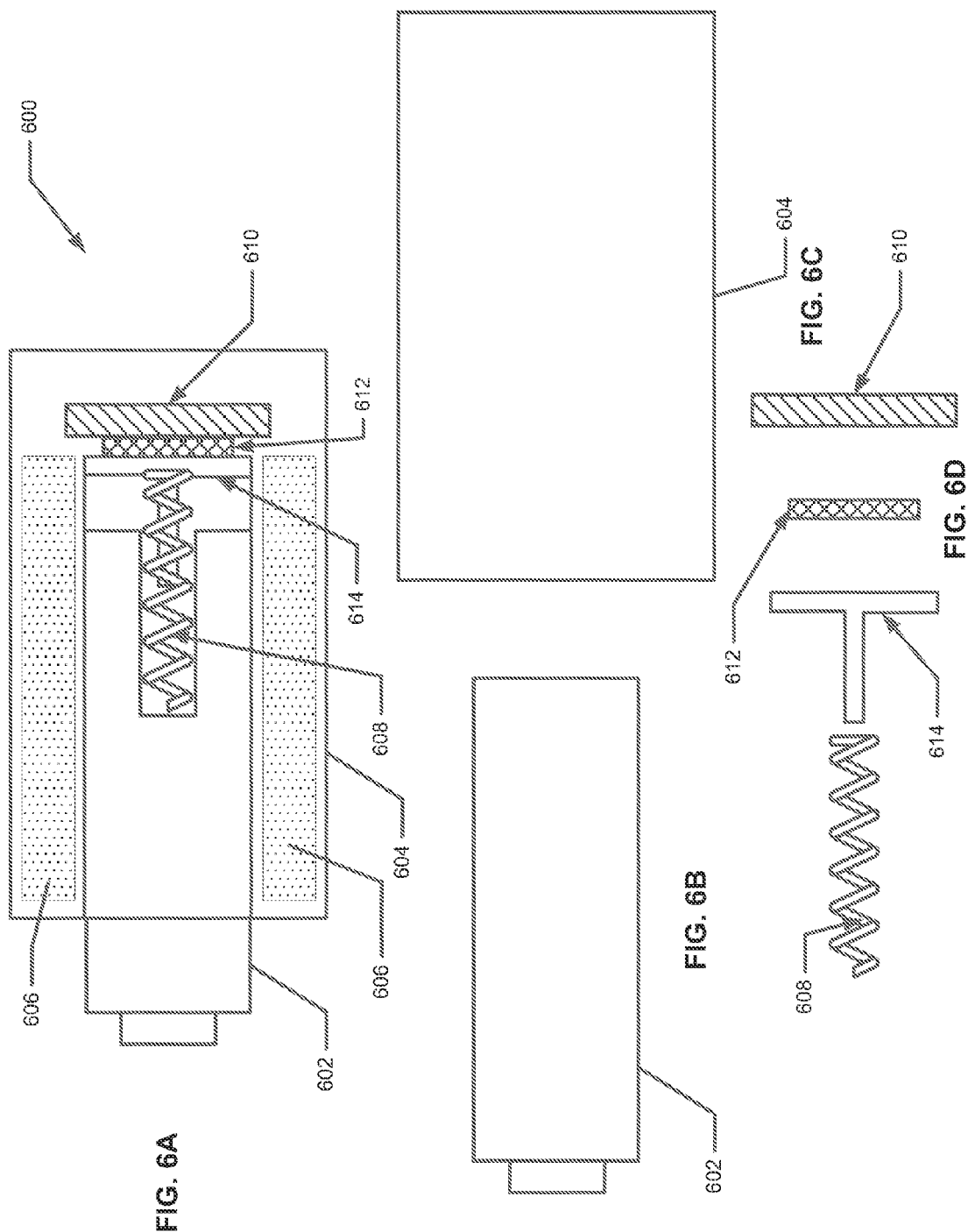
FIGS. 6A, 6B, 6C and 6D illustrate a cut-away view and exploded views of an aspect of an actuator that can be used in an embodiment of for use in a meter disconnect relay.

FIGS. 5A, 5B and 5C illustrate various exploded views and aspects of the conductive bridging section 108 and leaf spring 122 of the one or more disconnect switches 102 of an embodiment of a meter disconnect relay 100. In one aspect, the leaf spring 122 is used to apply force to the bridging section 108, which maintains the bridging section 108 within a window 1162 of a shuttle 116 and also further applies force to the contacts 110 of the source section 104 and the load section 106 through the one or more contacts 110 of the bridging section 108 when a disconnect switch 102 is closed. In one aspect, this force can be five Newtons (N), or greater. As noted above, in one aspect the shuttle 116 can over travel the point at which the contacts 110 of the source section 104 and the load section 106 first make contact thereby compressing the leaf spring 122 and applying additional force to the conducting section 108, which is transmitted to the contacts 110. The amount of over travel can be used to adjust the force applied to the source contacts 110 and the load contacts 110 by the contacts 110 of the bridging section 108. In one aspect, the one or more contacts 110 (which include the contacts 110 of the bridging section 108, the source section 104 and the load section 106) can at least be partially welded to their respective conductive sections. In another aspect, the one or more contacts 110 (which include the contacts 110 of the bridging section 108, the source section 104 and the load section 106) can at least be partially riveted to their respective conductive sections.

FIG. 5A illustrates a disassembled side view of an embodiment of a rigid, conductive bridging section 108 having one or more contacts 110 and a leaf spring 122. FIG. 5B illustrates a top or plan view of an embodiment of a rigid, conductive bridging section 108 and a leaf spring 122. Shown in FIG. 5B are the holes 502 for engaging the pins 11623 of the shuttle windows 1162 to pivotally connect the bridging section 108 and the leaf spring 122 with the shuttle 116. Though shown with two holes 502, it is to be appreciated that more or fewer holes 502 are contemplated within the scope of embodiments of the present invention, as are other means of connecting the bridging section 108 and leaf spring 122 with the shuttle 116. By allowing the bridging section 108 to pivot or float on pins 11623 or shafts, the bridging section 108 can move or pivot with very low friction.

The aspects of a pivoting spring 122 and contact bridge 108 as shown in FIGS. 5A, 5B and 5C allow the entire bridging section 108 and spring assembly 122 to pivot, break welds, and accommodate variations in mating contact positions (i.e., self-aligning), but yet has the spring force optimally located directly in line with the contacts 110. For example, the spring 122 "footprint" can be directly and linearly behind the one or more contacts 110 on the bridging section 108 for greater contact control of bounce. This configuration also provides a lever action such that a force exerted on one contact 110 of the bridging section 108 not only compresses the spring 122, but transfers more force to the contact 110 on the other side of the bridge 110 (as compared to other shorting bar/contact bridge system where the spring force is applied in the middle between the contacts and has a lower performance result.

FIG. 5C illustrates an alternate embodiment of a bridging section 108 and leaf spring 122 assembly that further comprises insulating material 504 that electrically insulates the bridging section 108 from the leaf spring 122. The insulating material 504 may also help thermally insulate the bridging section 108 from the leaf spring 122. In one aspect, the insulating material comprises Teflon™, though other materials are contemplated within the scope of embodiments of the present invention. In one aspect, the leaf spring 122 is comprised of stainless steel, though other materials are contemplated within the scope of this invention. In one aspect, using stainless steel for the spring 122 can facilitate tamper protection of the meter disconnect relay 100 because the stainless steel is minimally affected by magnetic forces used in tampering. The spring constant of the leaf spring 122 can be set as desired by adjustment of the parameters of the leaf spring 122 including width, shape, thickness, material, and the like. The spring constant can be used to adjust the force applied to the source contacts 110 and the load contacts 110 by the contacts 110 of the bridging section 108. The spring profile allows for a wide range of steel materials to be used and high variations in preload profiles so that a wide range of contact forces and spring characteristics can be used for expanded product applications and different performance parameters.

In one aspect, one or more contacts 110 of the meter disconnect relay 100 are comprised of silver-tin. In another aspect, one or more contacts 110 of the meter disconnect relay 100 are comprised of silver refractory contact metals. For example, the one or more relay contacts 110 can be at least partially comprised of silver/tungsten, silver molybdenum, silver tungsten carbide, silver titanium, titanium carbide and the like.

In one aspect, the contacts 110 are at least partially comprised of silver-tungsten. This material has shown a 5×+ greater life in the lab under 7 KVA fault conditions at 6 cycles than standard silver-tin contacts. Silver-tungsten contacts are still functional after a 12 KVA surge test at 4 cycles while other contact materials (typically AG/SN) blow off and are no longer functional causing the relay to fail. In one aspect, contacts 110 comprised of silver-tungsten are able to be used in close size to present (silver-tin) contacts for the application in the range of 45% to 44% silver as compared to other materials that typically use 88%+ sliver content. Therefore the silver contact is reduced providing a significant precious metals savings for the system. Contacts commonly used in meter service disconnect relays today typically use a silver tin alloy. The silver tin contacts under a fault condition will flow (or sacrifice) the silver to the outer edge of the contact surface. Depending on the severity and frequency of surge/s the copper substrate will be exposed and the contact silver will have an irregular surface. These conditions create higher resistance and arching that hastens the disconnect relay failure through either high heat rise and plastics melting or loss of relay connection. The silver tungsten contacts do not flow the silver to the edge of the contact or lose form to the extent that silver tin will. As a result, the contact life is significantly increased under the same conditions. Embodiments of the contacts 110 may be made from any process including, but not limited to, press sinter repress, liquid phase sintering, infiltration, hot isostatic pressing. The silver tungsten is in the form of a mixture that uses near pure silver in a mixture with tungsten. This mixture provides a hard structure with the tungsten that is much more welding and blow-off resistant as compared to materials being used today (i.e. AG/SN). A technical advantage is that embodiments of the disconnect relay 100 can survive more frequent and higher severity fault conditions in the field. As a result, the number of meter failures for this condition is significantly reduce saving money and giving a quality and longer field life advantage.

Another aspect comprises the use of silver molybdenum at least partially as the contact material for the contacts 110 in an embodiment of a meter disconnect relay 100. Silver molybdenum material can be used in close size to present contacts for the application in the range of 35% to 50% silver as compared to other materials that typically use 88%+ sliver content. Therefore, the silver content of the contacts 110 can be reduced providing a significant precious metals savings for the system. Generally, silver molybdenum contacts do not flow the silver to the edge of the contact or lose form to the extent of common silver tin contacts. As a result, contact life is significantly increased under the same conditions. Embodiments of silver molybdenum contacts 110 may be made from any process including, but not limited to, press sinter repress, liquid phase sintering, infiltration, hot isostatic pressing. The silver molybdenum is in the form of a mixture that uses near pure silver in a mixture with molybdenum. This mixture provides a hard structure that is much more welding and blow-off resistant as compared to materials being used today (i.e. AG/SN). A technical advantage is that the embodiment of a meter disconnect relay 100 can survive more frequent and higher severity fault conditions in the field. As a result the number of meter failures for this condition is significantly reduced saving money and giving a quality and longer field life advantage.

Another aspect is to use silver tungsten carbide at least partially as the contact material for contacts 100 in an embodiment of a meter disconnect relay 100. This material has a 5×+ greater life in the lab under 7 KVA fault conditions at 6 cycles. The contacts are still functional after a 12 KVA surge test at 4 cycles while other contact materials (typically AG/SN) blows off at such test levels and the contacts are no longer functional causing the relay to fail. Further, the material is able to be used in close size to present contacts for the application in the range of 35% to 60% silver as compared to other materials that typically use 88%+ sliver content (e.g., sliver tin). Therefore the silver content is reduced providing a significant precious metals savings for the system. Contacts commonly used in meter disconnect relays today typically use a silver tin alloy. The silver tin contacts under a fault condition will flow (or sacrifice) the silver to the outer edge of the contact surface. Depending on the severity and frequency of surge/s the copper substrate (when bimetal contact) will be exposed and the contact silver will have an irregular surface. These conditions create higher resistance and arching that hastens the disconnect relay failure through either high heat rise and plastics melting or loss of relay connection. The silver tungsten carbide contacts do not flow the silver to the edge of the contact or lose form to the extent of silver tin contacts. As a result, contact life is increased under the same conditions. Embodiments of the silver tungsten carbide contacts 110 may be made from any process including, but not limited to, press sinter repress, liquid phase sintering, infiltration, and hot isostatic pressing. The silver tungsten carbide is in the form of a mixture that uses near pure silver in a mixture with tungsten. This mixture provides a hard structure with the tungsten that is much more welding and blow-off resistant as compared to materials being used today (i.e. AG/SN). A technical advantage is that the disconnect relay 100 can survive more frequent and higher severity fault conditions in the field. As a result the number of meter failures for this condition is significantly reduced saving money and giving a quality and longer field life advantage.

In other aspects, the contacts 110 can be at least partially comprised of silver titanium or titanium carbide. Such contacts 110 can be formed from any process including, but not limited to, press sinter repress, liquid phase sintering, infiltration, and hot isostatic pressing.

FIGS. 6A, 6B, 6C and 6D illustrate a cut-away view and exploded views of an aspect of an actuator 112 that van be used in an embodiment of for use in a meter disconnect relay 100. In one aspect, the plunger is at least partially comprised of ferromagnetic material. Further comprising the embodiment of a solenoid 600 is a solenoid body 604, wherein an area of the solenoid body 604 is configured to receive at least a portion of the plunger 602 and electrical windings 606 within the solenoid body 604 substantially surround the area configured to receive at least a portion of the plunger 602 such that an electrical current through the electrical windings 606 will either apply force to the plunger 602 to move it out of the solenoid body 604 or to draw it within the solenoid body 604. Further comprising the embodiment of a solenoid 600 is a spring 608 that adaptively fits within the area configured to receive at least a portion of the plunger 602 and within a portion of the plunger 602 and a magnet 610. The magnet 610 can be configured to fit proximate to the area configured to receive at least a portion of the plunger 602. In one aspect, the spring 608 can be used to provide additional force to the plunger 602 when moving out of the solenoid body 604 and the magnet 610 can be used to latch the plunger 602 when the plunger 602 is forced to within close proximity of the magnet 610 within the solenoid body 604. In one aspect, the electric solenoid 600 can create a force of 5 N or higher when the plunger 602 is moving out of the solenoid body 604. In one aspect, the electric solenoid 600 can further comprise a metallic protector 612 and a pin 614. The metallic protector 612 can protect the magnet 610 from force applied to the magnet 610 by the spring 608 or the plunger 602 and the pin 614 can be used to align or strengthen the spring 608. In one aspect, the magnet can provide tamper resistance for the meter disconnect relay 100 as it would be very difficult to overcome the magnetic force between the plunger 602 and the magnet 610 when the plunger 602 is latched by use of an externally applied magnet.

While the methods, systems and devices have been described in connection with preferred embodiments and specific examples, it is not intended that the scope be limited to the particular embodiments set forth, as the embodiments herein are intended in all respects to be illustrative rather than restrictive.

Figure 7:
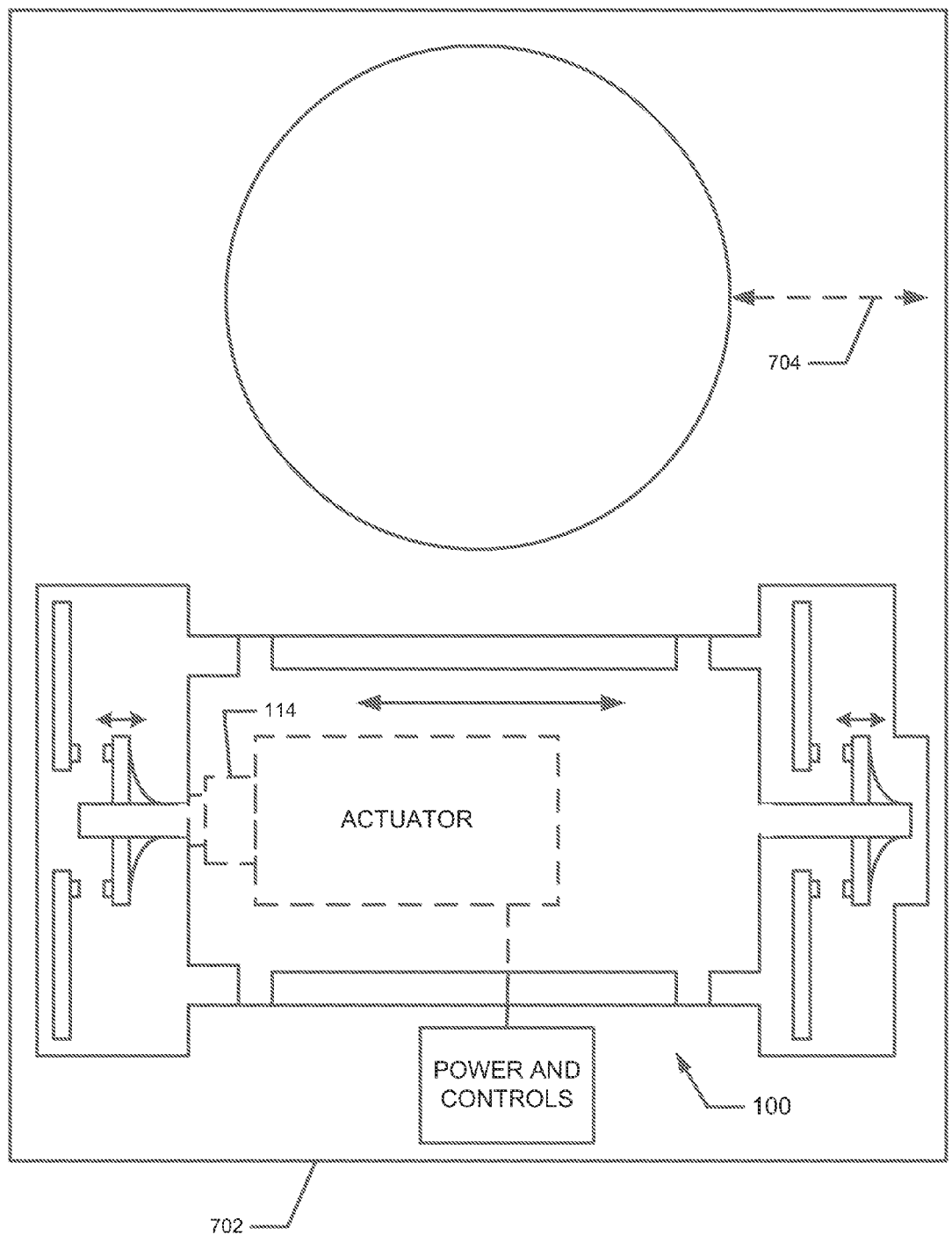
FIG. 7 is an illustration of an embodiment of a meter disconnect relay further comprising a utility revenue meter, wherein the meter disconnect relay is integrated into the utility revenue meter.

FIG. 7 is an illustration of an embodiment of a meter disconnect relay 100 further comprising a utility revenue meter 702, wherein the meter disconnect relay 100 is integrated into the utility revenue meter 702. In one aspect, the utility revenue meter 702 is an electric utility revenue meter.

In one aspect, the utility revenue meter 702 can be connected with a network 704, wherein signals received by the meter 702 over the network 704 can be used to control the meter disconnect relay 100 using the power and controls 124 of the meter disconnect relay 100. The network 704 can be wired (including fiber optic), wireless or a combination of wired and wireless. In one aspect, the utility revenue meter 702 comprises a smart meter. Smart meters are among the fundamental building blocks of smart grid deployments. They track and report energy usage by time of day, enabling utilities to charge less for electricity used during off-peak hours. As a result, consumers can choose to shift energy-intensive activities to times when rates are lower to save on energy costs. In general, smart devices can be configured to communicate with a smart meter and smart meters are configured to communicate with the smart grid. Generally, these communications are duplex. One non-limiting example of a smart meter is the GE 1210+c meter as available from General Electric Company (Schenectady, N.Y.). In one aspect, the network 704 may comprise an advanced metering infrastructure (AMI). AMI refers to systems that measure, collect and analyze energy usage, and interact with advanced devices such as electricity meters, gas meters, water meters, and the like through various communication media either on request (on-demand) or on pre-defined schedules. This infrastructure includes hardware, software, communications, consumer energy displays and controllers, customer associated systems, meter data management (MDM) software, supplier and network distribution business systems, and the like. The network 704 between the measurement devices (e.g., meters 702) and business systems allows collection and distribution of information to customers, suppliers, utility companies and service providers. This enables these businesses to either participate in, or provide, demand response solutions, products and services. By providing information to customers, the system assists a change in energy usage from their normal consumption patterns, either in response to changes in price or as incentives designed to encourage lower energy usage use at times of peak-demand periods or higher wholesale prices or during periods of low operational systems reliability.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications are referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following inventive concepts.

What is claimed is:

1. A meter disconnect relay comprised of:
   a base;
   an actuator situated within the base, wherein the base maintains a portion of the actuator stationary and allows a plunger of the actuator to move within the base;
   a shuttle at least partially comprised of non-conductive material and having one or more windows, wherein the shuttle is operably connected to and moved by the plunger of the actuator and wherein the shuttle can be moved within the base and at least a portion of the base provides a stop for movement of the shuttle;
   one or more disconnect switches that are opened or closed by movement of the shuttle, wherein each disconnect switch is comprised of:
   a rigid, conductive bridging section pivotally connected to a first face of one of the one or more windows in the shuttle, wherein the bridging section comprises at least two contacts, wherein the rigid, conductive bridging section is pivotally connected to the first face of the window in the shuttle by one or more pins extending from the first face of the window;
   a leaf spring pivotally connected to a second face of the one of the one or more windows of the shuttle, wherein the second face of the window is opposite the first face of the window and the leaf spring applies force to the bridging section; and
   a conductive source portion having a source contact and a conductive load portion having a load contact, wherein a first and second contact of the at least two contacts of the bridging portion are caused to substantially simultaneously come in contact with and disconnect from the source contact and the load contact by movement of the shuttle.

2. The meter disconnect relay of claim 1, wherein the meter disconnect relay is configured such that when closing the one or more disconnect switches, the shuttle continues to travel beyond a point where first and second contacts of the at least two contacts of the bridging portion first substantially simultaneously come in contact with the source contact and the load contact to cause additional force to be applied to the source contact and the load contact by the at least two contacts of the bridging portion through compression of the leaf spring.

3. The meter disconnect relay of claim 2, wherein the force applied to the source contact and the load contact by the at least two contacts of the bridging portion through compression of the leaf spring is 5 N or higher.

4. The meter disconnect relay of claim 3, wherein one or more of the source contact, the load contact and the at least two contacts of the bridging portion are at least partially comprised of silver-tin materials.

5. The meter disconnect relay of claim 3, wherein one or more of the source contact, the load contact and the at least two contacts of the bridging portion are comprised at least partially of one or more of silver tungsten, silver tungsten carbide, silver molybdenum, silver titanium or titanium carbide.

6. The meter disconnect relay of claim 1, wherein the one or more disconnect switches further comprise an insulating layer positioned such that the conductive bridging section is electrically insulated from the leaf spring.

7. The meter disconnect relay of claim 1, wherein the at least two contacts of the bridging section are at least partially welded to the bridging section.

8. The meter disconnect relay of claim 1, wherein the at least two contacts of the bridging section are at least partially riveted to the bridging section.

9. The meter disconnect relay of claim 1, further comprising a utility revenue meter, wherein the meter disconnect relay is integrated into the utility revenue meter.

10. The meter disconnect relay of claim 9, wherein the utility revenue meter is an electric utility revenue meter.

11. The meter disconnect relay of claim 1, wherein the leaf spring is pivotally connected to the second face of the window of the shuttle by one or more pins extending from the second face of the window.

12. The meter disconnect relay of claim 1, wherein the leaf spring is at least partially comprised of stainless steel.

13. The meter disconnect relay of claim 1, wherein the actuator is an electrical solenoid.

14. The meter disconnect relay of claim 1, wherein one or more of the source contact, the load contact and the at least two contacts of the bridging portion are at least partially comprised of silver-tin materials.

15. The meter disconnect relay of claim 1, wherein one or more of the source contact, the load contact and the at least two contacts of the bridging portion are at least partially comprised of silver refractory materials.

16. The meter disconnect relay of claim 15, wherein one or more of the source contact, the load contact and the at least two contacts of the bridging portion are comprised at least partially of one or more of silver tungsten, silver tungsten carbide, silver molybdenum, silver titanium or titanium carbide.

17. The meter disconnect relay of claim 15, wherein one or more of the source contact, the load contact and the at least two contacts of the bridging portion are at least partially comprised of 40 to 50% silver and 50 to 60% tungsten.

18. The meter disconnect relay of claim 15, wherein one or more of the source contact, the load contact and the at least two contacts of the bridging portion are at least partially comprised of 35 to 50% silver and 50 to 65% molybdenum.

19. The meter disconnect relay of claim 15, wherein one or more of the source contact, the load contact and the at least two contacts of the bridging portion are at least partially comprised of 35 to 50% silver and 50 to 65% tungsten carbide.

20. A meter disconnect relay comprised of:
a base;
an electrical solenoid situated within the base, wherein the base maintains a portion of the electrical solenoid stationary and allows a plunger of the electrical solenoid to move within the base, wherein the plunger is at least partially comprised of ferromagnetic material and wherein the electrical solenoid comprises a solenoid body, a spring and a magnet, wherein the spring is used to provide additional force to the plunger when moving out of the solenoid body and the magnet is used to latch the plunger when the plunger is forced to within close proximity of the magnet within the solenoid body;
a shuttle at least partially comprised of non-conductive material and having one or more windows, wherein the shuttle is operably connected to and moved by the plunger of the electrical solenoid and wherein the shuttle can be moved within the base and at least a portion of the base provides a stop for movement of the shuttle;
one or more disconnect switches that are opened or closed by movement of the shuttle, wherein each disconnect switch is comprised of:
a rigid, conductive bridging section pivotally connected to a first face of one of the one or more windows in the shuttle, wherein the bridging section comprises at least two contacts;
a leaf spring pivotally connected to a second face of the one of the one or more windows of the shuttle, wherein the second face of the window is opposite the first face of the window and the leaf spring applies force to the bridging section; and
a conductive source portion having a source contact and a conductive load portion having a load contact, wherein a first and second contact of the at least two contacts of the bridging portion are caused to substantially simultaneously come in contact with and disconnect from the source contact and the load contact by movement of the shuttle.

21. The meter disconnect relay of claim 20, wherein the plunger latching when the plunger is forced to within close proximity of the magnet within the solenoid body provides overcurrent protection for devices connected to the conductive load portion of the meter disconnect relay.

22. A system comprised of:
a meter; and
a meter disconnect relay integrated with the meter, wherein the meter disconnect relay comprises:
a base;
an actuator situated within the base, wherein the base maintains a portion of the actuator stationary and allows a plunger of the actuator to move within the base;
a shuttle at least partially comprised of non-conductive material and having one or more windows, wherein the shuttle is operably connected to and moved by the plunger of the actuator and wherein the shuttle can be moved within the base and at least a portion of the base provides a stop for movement of the shuttle; and
one or more disconnect switches that are opened or closed by movement of the shuttle, wherein each disconnect switch is comprised of:

a rigid, conductive bridging section pivotally connected to a first face of one of the one or more windows in the shuttle, wherein the bridging section comprises at least two contacts;

a leaf spring pivotally connected to a second face of the one of the one or more windows of the shuttle, wherein the second face of the window is opposite the first face of the window and the leaf spring applies force to the bridging section and wherein the leaf spring is pivotally connected to the second face of the window of the shuttle by one or more pins extending from the second face of the window; and a conductive source portion having a source contact and a conductive load portion having a load contact, wherein a first and second contact of the at least two contacts of the bridging portion are caused to substantially simultaneously come in contact with and disconnect from the source contact and the load contact by movement of the shuttle.

23. The system of claim 22 further comprising a network, wherein the network is connected with the meter and signals received by the meter over the network can be used to control the meter disconnect relay.

24. The system of claim 22, wherein the meter comprises a meter base and at least a portion of the base comprises a portion of the meter base.

25. The system of claim 22, wherein the meter disconnect relay is configured such that when closing the one or more disconnect switches, the shuttle continues to travel beyond a point where first and second contacts of the at least two contacts of the bridging portion first substantially simultaneously come in contact with the source contact and the load contact to cause additional force to be applied to the source contact and the load contact by the at least two contacts of the bridging portion through compression of the leaf spring.

26. The system of claim 25, wherein the force applied to the source contact and the load contact by the at least two contacts of the bridging portion through compression of the leaf spring is 5 N or higher.

27. The system of claim 26, wherein one or more of the source contact, the load contact and the at least two contacts of the bridging portion are at least partially comprised of silver-tin materials.

28. The system of claim 26, wherein one or more of the source contact, the load contact and the at least two contacts of the bridging portion are at least partially comprised of silver refractory materials.

29. The system of claim 28, wherein one or more of the source contact, the load contact and the at least two contacts of the bridging portion are comprised at least partially of one or more of silver tungsten, silver tungsten carbide, silver molybdenum, silver titanium or titanium carbide.

30. The system of claim 22, wherein the one or more disconnect switches further comprise an insulating layer positioned such that the conductive bridging section is electrically insulated from the leaf spring.

31. The system of claim 22, wherein the at least two contacts of the bridging section are at least partially welded to the bridging section.

32. The system of claim 22, wherein the at least two contacts of the bridging section are at least partially riveted to the bridging section.

33. The system of claim 22, wherein the meter is an electric utility revenue meter.

34. The system of claim 22, wherein the rigid, conductive bridging section is pivotally connected to the first face of the window in the shuttle by one or more pins extending from the first face of the window.

35. The system of claim 22, wherein the leaf spring is at least partially comprised of stainless steel.

36. The system of claim 22, wherein the actuator is an electrical solenoid.

37. The system of claim 36, wherein the plunger is at least partially comprised of ferromagnetic material and wherein the electrical solenoid comprises a solenoid body, a spring and a magnet, wherein the spring is used to provide additional force to the plunger when moving out of the solenoid body and the magnet is used to latch the plunger when the plunger is forced to within close proximity of the magnet within the solenoid body.

38. The system of claim 37, wherein the plunger latching when the plunger is forced to within close proximity of the magnet within the solenoid body provides overcurrent protection for devices connected to the conductive load portion of the meter disconnect relay.

39. The system of claim 22, wherein one or more of the source contact, the load contact and the at least two contacts of the bridging portion are at least partially comprised of silver-tin materials.

40. The system of claim 22, wherein one or more of the source contact, the load contact and the at least two contacts of the bridging portion are at least partially comprised of silver refractory materials.

41. The system of claim 40, wherein one or more of the source contact, the load contact and the at least two contacts of the bridging portion are comprised at least partially of one or more of silver tungsten, silver tungsten carbide, silver molybdenum, silver titanium or titanium carbide.

42. The system of claim 40, wherein one or more of the source contact, the load contact and the at least two contacts of the bridging portion are at least partially comprised of 40 to 50% silver and 50 to 60% tungsten.

43. The system of claim 40, wherein one or more of the source contact, the load contact and the at least two contacts of the bridging portion are at least partially comprised of 35 to 50% silver and 50 to 65% molybdenum.

44. The system of claim 40, wherein one or more of the source contact, the load contact and the at least two contacts of the bridging portion are at least partially comprised of 35 to 50% silver and 50 to 65% tungsten carbide.

* * * * *